US012002890B2

(12) United States Patent
Yoo et al.

(10) Patent No.: US 12,002,890 B2
(45) Date of Patent: Jun. 4, 2024

(54) SEMICONDUCTOR PROTECTION DEVICE

(71) Applicant: SAMSUNG ELECTRONICS CO., LTD., Suwon-si (KR)

(72) Inventors: Jaehyun Yoo, Suwon-si (KR); Kyuok Lee, Yongin-si (KR); Uihui Kwon, Hwaseong-si (KR); Junhyeok Kim, Seoul (KR); Yongwoo Jeon, Seoul (KR); Dawon Jeong, Hwaseong-si (KR); Jaehyok Ko, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 299 days.

(21) Appl. No.: 17/585,284

(22) Filed: Jan. 26, 2022

(65) Prior Publication Data

US 2022/0376119 A1 Nov. 24, 2022

(30) Foreign Application Priority Data

May 21, 2021 (KR) ........................ 10-2021-0065293
Aug. 3, 2021 (KR) ........................ 10-2021-0102031

(51) Int. Cl.
*H01L 29/86* (2006.01)
*H01L 29/06* (2006.01)
(Continued)

(52) U.S. Cl.
CPC ........ *H01L 29/861* (2013.01); *H01L 29/0634* (2013.01); *H01L 29/404* (2013.01); *H01L 29/0649* (2013.01)

(58) Field of Classification Search
CPC . H01L 29/861; H01L 29/0634; H01L 29/404; H01L 29/0649; H01L 27/0259;
(Continued)

(56) References Cited

U.S. PATENT DOCUMENTS 8,643,111 B1 * 2/2014 Jou ..................... H01L 27/0259 257/E21.409
9,190,501 B2 11/2015 Ito et al.
(Continued)

FOREIGN PATENT DOCUMENTS

CN 1851923 A * 10/2006
CN 102385643 A 3/2012
(Continued)

*Primary Examiner* — Mohammad M Hoque
(74) *Attorney, Agent, or Firm* — Myers Bigel, P.A.

(57) ABSTRACT

A semiconductor protection device includes: an N-type epitaxial layer, a device isolation layer disposed in the N-type epitaxial layer, an N-type drift region disposed below the device isolation layer, an N-type well disposed in the N-type drift region, first and second P-type drift regions, respectively disposed to be in contact with the device isolation layer, and spaced apart from the N-type drift region, first and second P-type doped regions, respectively disposed in the first and second P-type drift regions, first and second N-type floating wells, respectively disposed in the first and second P-type drift regions to be spaced apart from the first and second P-type doped regions, and disposed to be in contact with the device isolation layer, and first and second contact layer, respectively disposed to cover the first and second N-type floating well, to be in contact with the device isolation layer.

20 Claims, 14 Drawing Sheets

(51) Int. Cl.
*H01L 29/40* (2006.01)
*H01L 29/861* (2006.01)

(58) Field of Classification Search
CPC ........... H01L 29/66098; H01L 29/0692; H01L 29/402; H01L 29/0646; H01L 27/0248; H01L 27/0292; H01L 27/0296
USPC .......................................................... 257/490
See application file for complete search history.

(56) References Cited

U.S. PATENT DOCUMENTS

| | | | |
|---|---|---|---|
| 10,037,988 B1 | 7/2018 | Solaro et al. | |
| 10,937,780 B2 | 3/2021 | Mallikarjunaswamy et al. | |
| 2010/0171149 A1 | 7/2010 | Denison et al. | |
| 2012/0241861 A1* | 9/2012 | Chen .................. | H01L 29/0634 257/E21.409 |
| 2020/0161466 A1* | 5/2020 | Yen .................... | H01L 29/7302 |

FOREIGN PATENT DOCUMENTS

| | | | | |
|---|---|---|---|---|
| CN | 108109916 A | | 6/2018 | |
| CN | 108807371 A | * | 11/2018 | ......... H01L 27/0262 |
| CN | 109103182 A | | 12/2018 | |
| CN | 111341844 A | * | 6/2020 | ............ H01L 23/60 |
| CN | 111341844 A | | 6/2020 | |

* cited by examiner

SEMICONDUCTOR PROTECTION DEVICE

CROSS-REFERENCE TO RELATED APPLICATION(S)

This application claims benefit of priority to Korean Patent Application Nos. 10-2021-0065293 filed on May 21, 2021 and 10-2021-0102031 filed on Aug. 3, 2021 in the Korean Intellectual Property Office, the disclosures of which are incorporated herein by reference in their entirety.

BACKGROUND

The present disclosure relates generally to semiconductor devices and, more particularly, to the protection of semiconductor devices.

A semiconductor system, such as a system on chip (SOC), a microcontroller unit (MCU) or a display driver IC (DDI), may include a plurality of peripheral devices including a processor, memory, logic circuits, audio and image processing circuits, various interface circuits, and the like. A semiconductor protection device may be provided in these peripheral devices to prevent electrostatic discharge (ESD) or electrical overstress (EOS).

SUMMARY

Example embodiments provide a semiconductor protection device having improved breakdown voltage characteristics and reduced ON-resistance $R_{ON}$.

According to an example embodiment, a semiconductor protection device includes: an N-type buried layer on a P-type substrate, an N-type epitaxial layer on the N-type buried layer, a device isolation layer on an upper surface of the N-type epitaxial layer, an N-type drift region below the device isolation layer, an N-type well in the N-type drift region, first and second P-type drift regions, each of the first and second P-type drift regions in contact with a respective opposite end of the device isolation layer and spaced apart from the N-type drift region, first and second high voltage P-type wells below the first and second P-type drift regions and in contact with the N-type buried layer, first and second P-type wells, each of the first and second P-type wells in a respective one of the first and second P-type drift regions, first and second N-type floating wells, each of the first and second N-type floating wells in a respective one of the first and second P-type drift regions and spaced apart from a respective one of the first and second P-type wells, and wherein each of the first and second N-type floating wells is in contact with a respective one of the opposite ends of the device isolation layer, first and second P-type doped regions, each of the first and second P-type doped regions in a respective one of the first and second P-type wells, a first contact layer on the N-type epitaxial layer and in contact with the first N-type floating well and the device isolation layer, a second contact layer on the N-type epitaxial layer and in contact with the second N-type floating well and the device isolation layer, a cathode electrode on the first P-type doped region and spaced apart from the first contact layer, and an anode electrode on the second P-type doped region and spaced apart from the second contact layer.

According to an example embodiment, a semiconductor protection device includes: an N-type epitaxial layer, a device isolation layer on an upper surface of the N-type epitaxial layer, an N-type drift region below the device isolation layer, an N-type well in the N-type drift region, first and second P-type drift regions, each of the first and second P-type drift regions in contact with a respective opposite end of the device isolation layer, and spaced apart from the N-type drift region, first and second P-type doped regions, each of the first and second P-type doped regions in a respective one of the first and second P-type drift regions, first and second N-type floating wells, each of the first and second N-type floating wells in a respective one of the first and second P-type drift regions and spaced apart from a respective one of the first and second P-type doped regions, and wherein each of the first and second N-type floating wells is in contact with a respective one of the opposite ends of the device isolation layer, a first contact layer on the N-type epitaxial layer and in contact with the first N-type floating well and the device isolation layer, and a second contact layer on the N-type epitaxial layer and in contact with the second N-type floating well and the device isolation layer.

According to an example embodiment, a semiconductor protection device may include: a first conductivity-type epitaxial layer having first and second regions. The first region includes: a device isolation layer on an upper surface of the first conductivity-type epitaxial layer, wherein the device isolation layer overlaps a central axis of the semiconductor protection device; a first conductivity-type drift region below the device isolation layer; a first conductivity-type well in the first conductivity-type drift region; a second conductivity-type drift region in contact with the device isolation layer and spaced apart from the first conductivity-type drift region; a high voltage second conductivity-type well below the second conductivity-type drift region; a second conductivity-type doped region in the second conductivity-type drift region; a first conductivity-type floating well spaced apart from the second conductivity-type doped region in the second conductivity-type drift region; a contact layer on the first conductivity-type epitaxial layer, wherein the contact layer overlaps the first conductivity-type floating well and is in contact with the device isolation layer; and an electrode on the second conductivity-type doped region and spaced apart from the contact layer. The second region and the first region are mirror-symmetrical with respect to the central axis.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
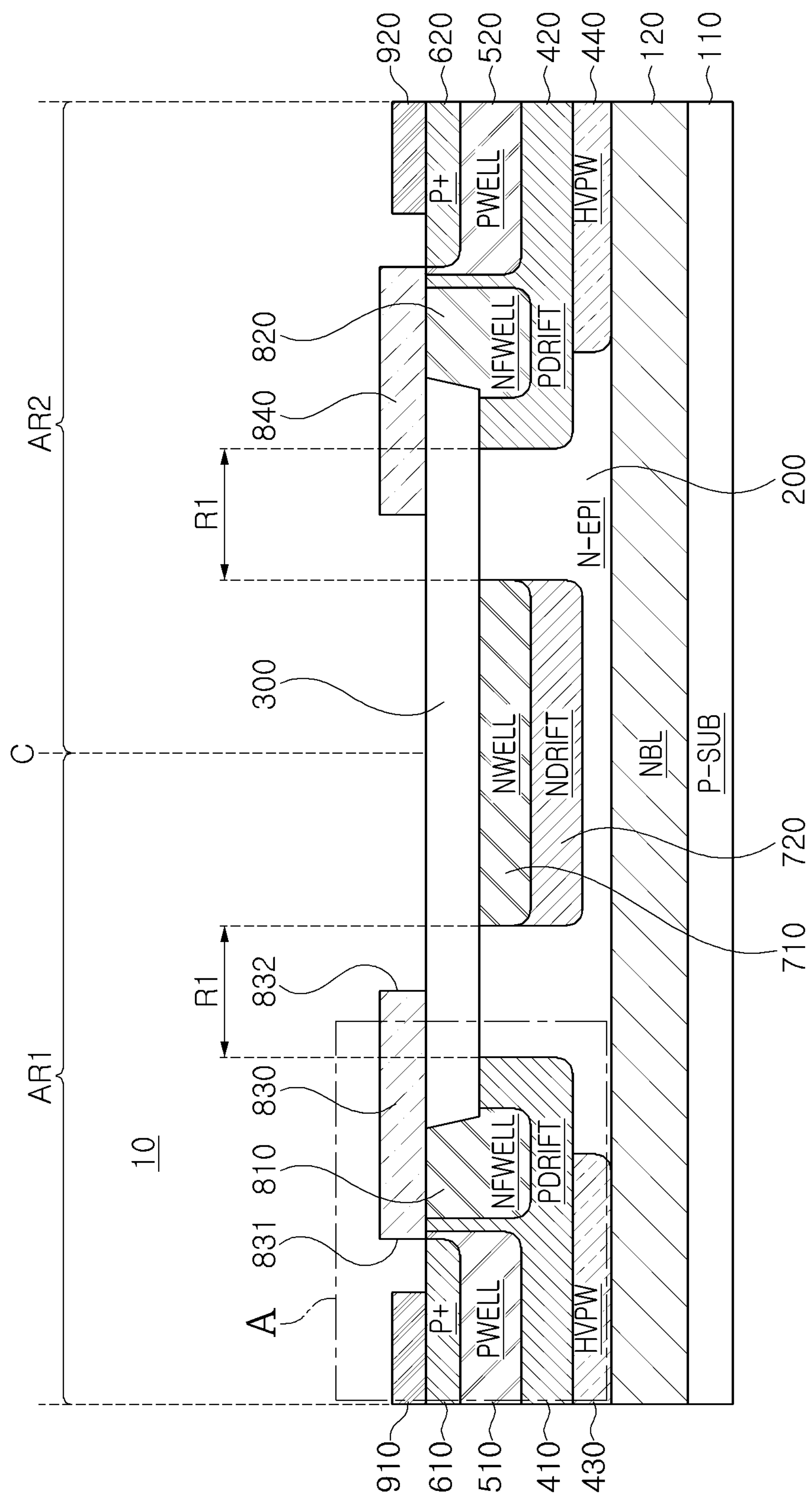
FIG. 1 is a cross-sectional view of a semiconductor protection device according to an example embodiment.
Figure 4:
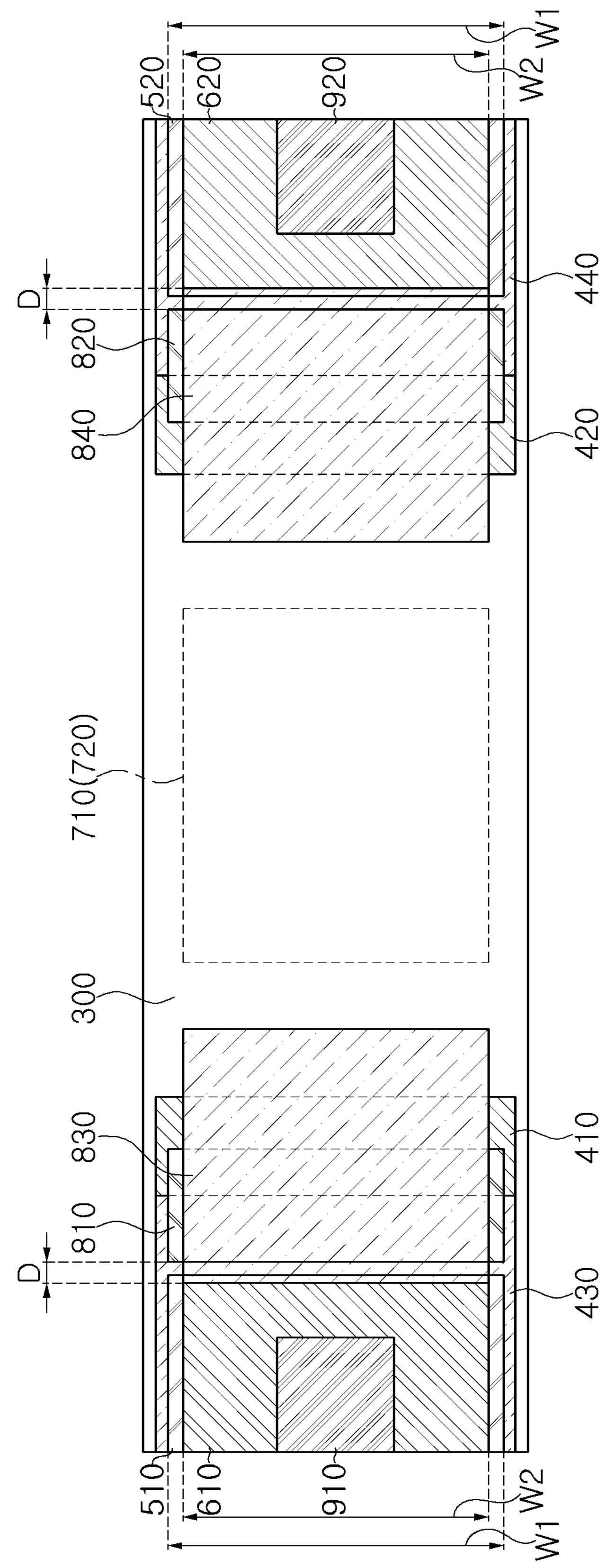
FIG. 4 is a conceptual layout view of a semiconductor device according to an example embodiment.

A semiconductor protection device 10 according to an example embodiment will be described with reference to FIGS. 1 and 4. FIG. 1 is a cross-sectional view of a semiconductor protection device according to an example embodiment, and FIG. 4 is a conceptual layout view of a semiconductor device according to an example embodiment.

The semiconductor protection device 10 according to an example embodiment may be a lateral bipolar junction transistor (a lateral BJT) disposed on a semiconductor substrate in the form of a system on chip (SoC), and may be used as a transient voltage suppressor (TVS) device. For example, the semiconductor protection device 10 may be fabricated together with various devices on a single semiconductor substrate through a bipolar-CMOS-DMOS process (BCD) process. For example, a device fabricated together with a BJT device on a single semiconductor substrate through a BCD process may include an nLDMOS, a pLDMOS, an isolated CMOS, a BiCMOS, a CDMOS, an nDMOS, a pDMOS, a vertical NPN, a lateral PNP, a Schottky diode, and the like.

The semiconductor protection device 10 according to an example embodiment may include a substrate (P-SUB) 110, an N-type buried layer (NBL) 120, an N-type epitaxial layer (N-EPI) 200, a device isolation layer 300, N-type drift region (NDRIFT) 720, an N-type well (NWELL) 710, first and second P-type drift regions (PDRIFT) 410 and 420, first and second high voltage P-type wells (HVPW) 430 and 440, first and second P-type wells (PWELL) 510 and 520, first and second N-type floating wells (NFWELL) 810 and 820, first and second P-type doped regions (P+) 610 and 620, first and second contact layers 830 and 840, and first and second electrodes 910 and 920. In the present embodiment, a first conductivity type and a second conductivity type will be described as being N-type and P-type, respectively. However, example embodiments are not limited thereto, and may be equally applied to the case in which the first conductivity type and the second conductivity type are P-type and N-type, respectively. The semiconductor protection device 10 may have a structure in which a first region AR1 and a second region AR2 are mirror-symmetrical with each other with respect to a central axis C of the N-type well (NWELL) 710, as illustrated in FIG. 1. The term "mirror-symmetrical" as used herein is intended to mean two structures or regions are mirror images of each other.

The substrate 110 may be a P-type semiconductor substrate. The substrate 110 may be, for example, a silicon substrate, a gallium arsenide substrate, a silicon-germanium substrate, a ceramic substrate, a quartz substrate, a glass substrate for a display device, or a semiconductor on insulator (SOI) substrate.

The N-type buried layer (NBL) 120 may be disposed on the substrate 110. For example, the N-type buried layer 120 may be formed by performing an ion implantation process, using N-type impurities, on the substrate 110.

The N-type epitaxial layer (N-EPI) 200 may be disposed on the N-type buried layer 120. For example, the N-type epitaxial layer 200 may be formed using a selective epitaxial growth (SEG) method, a solid phase epitaxial growth (SPE) method, or the like. In the N-type epitaxial layer 200, the N-type drift region 720, the N-type well 710, the first and second P-type drift regions 410 and 420, the first and second high voltage P-type wells 430 and 440, the first and second P-type wells 510 and 520, the first and second N-type floating wells 810 and 820, and the first and second P-type doped regions 610 and 620 may be formed.

The device isolation layer 300 may be formed on an upper surface of the N-type epitaxial layer 200. The device isolation layer 300 may be provided to separate devices in the N-type epitaxial layer 200 from each other, and may be formed through a shallow trench isolation (STI) process, or the like. The device isolation layer 300 may be formed of oxide.

The N-type drift region 720 may be formed below the device isolation layer 300. In the N-type drift region 720, the N-type well 710 may be formed to be in contact with the device isolation layer 300. In an example embodiment, an impurity concentration of the N-type well 710 may be higher than an impurity concentration of the N-type drift region 720.

The first and second P-type drift regions 410 and 420 may be formed in the N-type epitaxial layer 200, and may be spaced apart from each other by the device isolation layer 300. The first and second P-type drift regions 410 and 420 may be formed to be adjacent to an upper surface of the N-type epitaxial layer 200, and may each be formed to be in contact with the device isolation layer 300. The first and second P-type drift regions 410 and 420 may be formed on the N-type epitaxial layer 200 to be mirror-symmetrical with each other with respect to the N-type well 710 interposed therebetween. Each of the first and second P-type drift regions 410 and 420 may be formed to be spaced apart from the N-type drift region 720 by a first separation distance R1. Also, each of the first and second P-type drift regions 410 and 420 may be formed to be spaced apart from the N-type buried layer 120.

The first and second P-type wells 510 and 520 and first and second N-type floating wells 810 and 820 may be formed in the first and second P-type drift regions 410 and 420, respectively. The first P-type well 510 may be formed to be mirror-symmetrical to the second P-type well 520 with respect to the N-type well 710 interposed therebetween. The first N-type floating well 810 may be formed to be mirror-symmetrical to the second N-type floating well 810 with respect to the N-type well 710 interposed therebetween.

The first and second P-type wells 510 and 520 may be formed to be spaced apart from the first and second N-type floating wells 810 and 820, respectively. Referring to FIG. 4, each of the first and second P-type wells 510 and 520 may be formed to have substantially the same width W1 as each of the first and second N-type floating wells 810 and 820. In an example embodiment, an impurity concentration of the first P-type well 510 may be higher than an impurity concentration of the first P-type drift region 410. Similarly, an impurity concentration of the second P-type well 520 may be higher than an impurity concentration of the second P-type drift region 420.

The first and second N-type floating wells 810 and 820 may be formed in the first and second P-type drift regions 410 and 420, respectively, and may be electrically floating. The first and second N-type floating wells 810 and 820 may be formed to be spaced apart from the first and second P-type wells 510 and 520 in the N-type well 710 direction, respectively, as illustrated in FIG. 1. The first and second N-type floating wells 810 and 820 may be formed to be in contact with the device isolation layer 300. When the first and second N-type floating wells 810 and 820 are formed to be in contact with the device isolation layer 300, the first and second N-type floating wells 810 and 820 may be stably formed. However, example embodiments are not limited thereto, and the first and second N-type floating wells 810 and 820 may be disposed to be spaced apart from the device isolation layer 300 according to example embodiments. In an example embodiment, the first and second N-type floating wells 810 and 820 may be simultaneously doped with the same N-type impurity as the N-type well 710. Accordingly, an impurity concentration of the first and second N-type floating wells 810 and 820 may be substantially the same as an impurity concentration of the N-type well 710. In addition, each of the first and second N-type floating wells 810 and 820 may be formed to have substantially the same depth as the N-type well 710, as illustrated in FIG. 1.

The first and second N-type floating wells 810 and 820 may be disposed in the first and second P-type drift regions 410 and 420 to disperse a flow of current shallowly flowing along a surface of the device isolation layer 300 such that the flow of the shallowly flowing current is changed into a flow of current flowing more deeply and thickly downwardly of the first and second P-type drift regions 410 and 420.

As a distance D (FIG. 4) between the first and second N-type floating wells 810 and 820 and the first and second P-type doped regions 610 and 620 is decreased, a breakdown voltage BV of the semiconductor protection device 10 may be increased. As the distance D between the first and second N-type floating wells 810 and 820 and the first and second P-type doped regions 610 and 620 is increased, the breakdown voltage BV of the semiconductor protection device 10 may be decreased. Accordingly, the semiconductor protection device 10 according to an example embodiment may adjust the distance D between the first and second N-type floating wells 810 and 820 and the first and second P-type doped regions 610 and 620 to adjust a breakdown voltage.

The first and second P-type doped regions 610 and 620 may be formed in the first and second P-type wells 510 and 520, respectively. In an example embodiment, an impurity concentration of each of the first and second P-type doped regions 610 and 620 may be higher than an impurity concentration of each of the first and second P-type wells 510 and 520.

The first and second contact layers 830 and 840 may be disposed on the N-type epitaxial layer 200. The first and second contact layers 830 and 840 may be formed to be in contact with the first and second N-type floating wells 810 and 820, first and second P-type drift regions 410 and 420, and the device isolation layer 300, respectively, as illustrated in FIG. 1. In addition, the first and second contact layers 830 and 840 may be formed so as not to overlap the first and second P-type doped regions 610 and 620, respectively, as illustrated in FIG. 1. Referring to FIG. 4, a width W2 of each of the first and second contact layers 830 and 840 may be smaller than a width W1 of each of the first and second P-type wells 510 and 520.

In an example embodiment, the first and second contact layers 830 and 840 may be formed by forming an oxide layer on upper surfaces of the first and second P-type drift regions 410 and 420 and the first and second N-type floating wells 810 and 820, depositing a polysilicon layer on the oxide layer, and patterning the resultant structure. The first and second contact layers 830 and 840 may be implemented using various conductive materials such as a metal, a combination of metal and polysilicon, or the like. The metal may be a material including at least one of tungsten and aluminum.

The second contact layer 840 may be formed to be mirror-symmetrical to the first contact layer 830 with the N-type well 710 interposed therebetween, as illustrated in FIG. 1. Hereinafter, only the first contact layer 830 will be described in detail, and a detailed description of the second contact layer 840 will be omitted.

Figure 2:
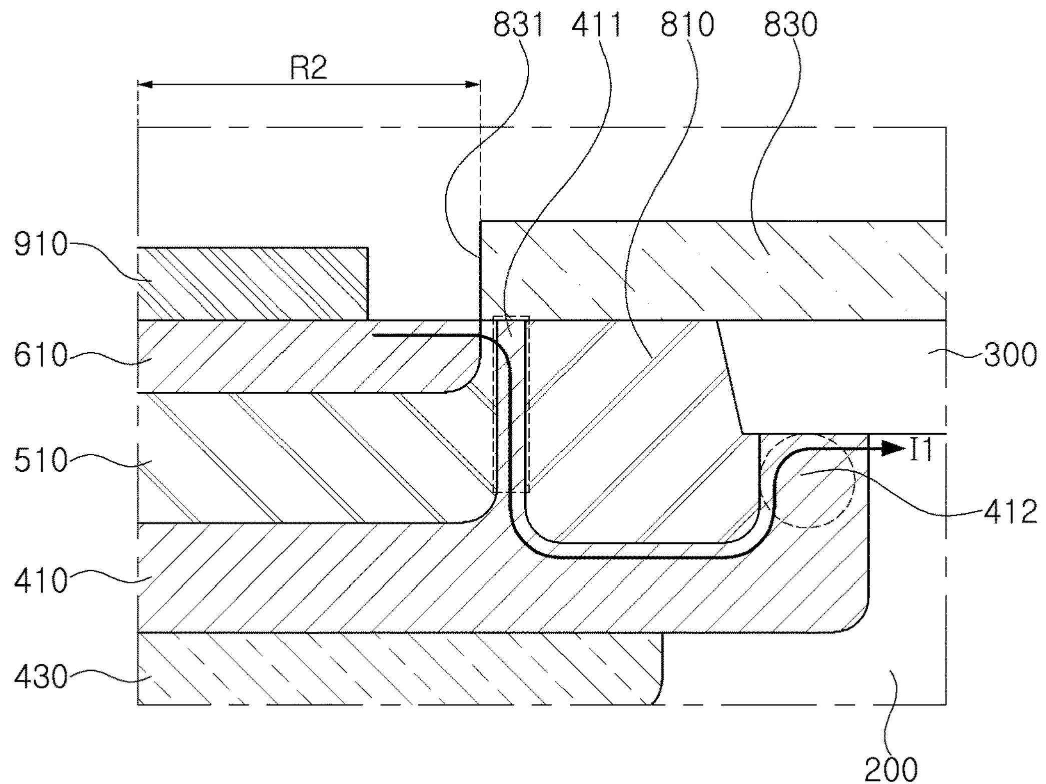
FIGS. 2 and 3 are views illustrating current flows of an example embodiment and a comparative example, respectively.

Referring to FIGS. 1 and 2, the first contact layer 830 may be disposed to be in contact with an upper surface of the N-type epitaxial layer 200. The first contact layer 830 may be formed to be in contact with the first N-type floating well 810, the first P-type drift region 410, and the device isolation layer 300. In example embodiments, the first contact layer 830 may be formed to be in contact with the first P-type well 510. Also, the first contact layer 830 may be formed so as not to overlap the first P-type doped region 610.

The first contact layer 830 may be used as a type of mask to prevent impurities from being doped during formation of the first P-type doped region 610. That is, the first contact layer 830 may allow a region R2 (FIG. 2), in which the first P-type doped region 610 is formed, to be self-aligned. The first contact layer 830 may be formed to have a thickness lower than a thickness of a typical mask used in a doping process. Accordingly, when the first contact layer 830 is doped with impurities, the selectivity of the first P-type doped region 610 formed by doping is improved, as compared with the case in which impurities are doped using a typical mask.

A first side surface 831 of the first contact layer 830 may be disposed to be spaced apart from the first electrode 910, and may be disposed to be within the first P-type well 510. A second side surface 832, disposed in a direction opposing the first side surface 831, may be disposed between the first P-type drift region 410 and the N-type well 710, and may be disposed to overlap the device isolation layer 300.

Since the first contact layer 830 is disposed on the first P-type drift region 410, a reduced surface field (RESURF) effect may be provided on the first P-type drift region 410 by an electric field of the first contact layer 830. Accordingly, a flow of current flowing shallowly along the surface of the device isolation layer 300 may be changed into a flow of current flowing more deeply and thickly downwardly of the first P-type drift region 410.

The first and second electrodes 910 and 920 may be formed in the first and second P-type doped regions 610 and 620, respectively. The first electrode 910 may be electrically connected to the first P-type doped region 610 to constitute a cathode electrode, and the second electrode 920 may be electrically connected to the second P-type doped region 620 to constitute an anode electrode.

The first and second high voltage P-type wells 430 and 440 may be formed in the N-type epitaxial layer 200. The first and second high voltage P-type wells 430 and 440 may be formed below the first and second P-type drift regions 410 and 420, respectively. The first high voltage P-type well 430 may be formed to be in contact the first P-type drift region 410 and the N-type buried layer 120. The second high voltage P-type well 440 may be formed to be in contact with the second P-type drift region 420 and the N-type buried layer 120.

Hereinafter, an operation of the semiconductor protection device 10 having the above-described configuration will be described. The semiconductor protection device 10 according to an example embodiment may be disposed on an input terminal of the device to be protected and formed on a single semiconductor substrate to remove electrostatic discharge (ESD) or electrical overstress (EOS) applied through the input terminal before the device to be protected is damaged by the ESD or the EOS.

Figure 3:
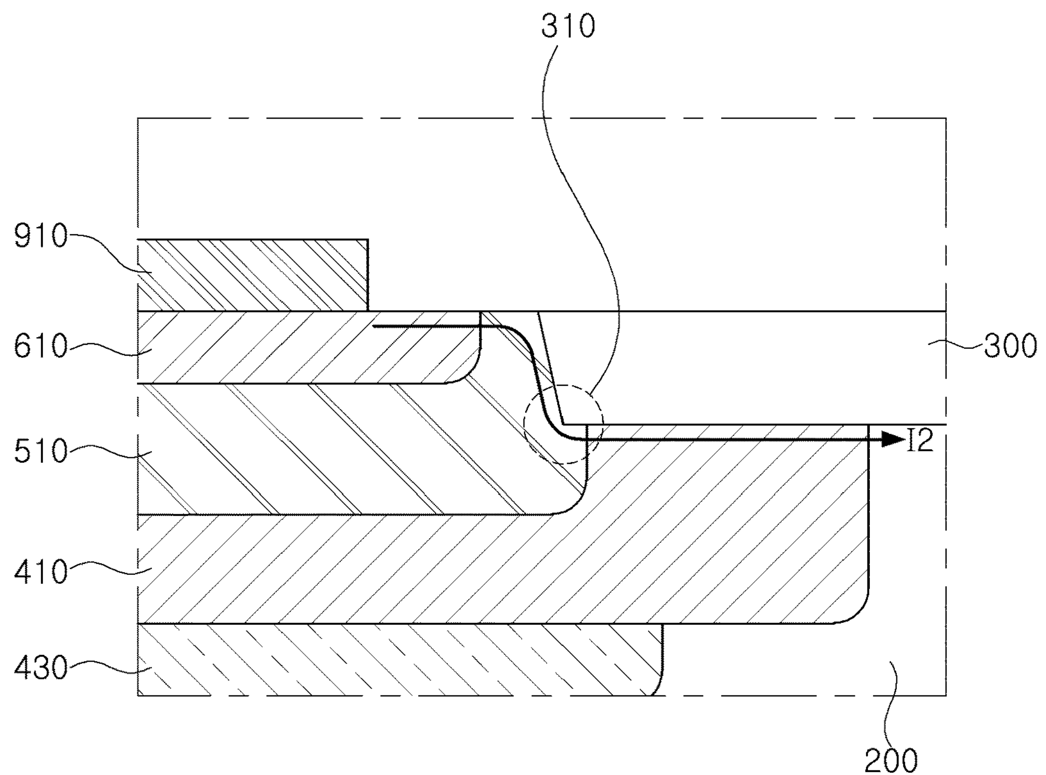

An operation of the semiconductor protection device 10 will be described with reference to FIGS. 2 and 3. FIGS. 2 and 3 are views illustrating current flows of an example embodiment and a comparative example, respectively.

Referring to FIG. 3, in a semiconductor protection device according to a comparative example, current I2 may be triggered and then flow shallowly along an interface of a device isolation layer 300. In particular, when ESD or EOS is applied to the semiconductor protection device, the current I2 may be concentrated to flow through an interface 310 at which the first P-type drift region 410 is in contact with the device isolation layer 300, which may cause power consumption at the interface 310 to be rapidly increased. When the power consumption is rapidly increased, generation of heat may also be proportionally increased and thermal destruction may easily occur at the interface 310 in contact with the device isolation layer 300 having relatively low thermal conductivity. That is, when ESD or EOS is applied to the semiconductor protection device according to the comparative example, thermal destruction may easily occur because a current-concentrated position and a heat-generated position overlap each other.

On the other hand, referring to FIG. 2, in the semiconductor protection device 10 according to an example embodiment, current I1 may be triggered and then flow while being spaced apart from an interface of the device isolation layer 300 by the first N-type floating well 810 and the first contact layer 830. Since the current I1 flows while being spaced apart from the interface of the device isolation layer 300, current concentration may be reduced, so that thermal destruction may not easily occur. The current I1 may flow while being concentrated in a narrow region 411 between the first P-type well 510 and the first N-type floating well 810, but may be spaced apart from an interface 412 of the device isolation layer 300 in which heat is generated. Therefore, a current-concentrated position and a heat-generated position may not overlap each other, so that thermal destruction does not easily occur.

Figure 8:
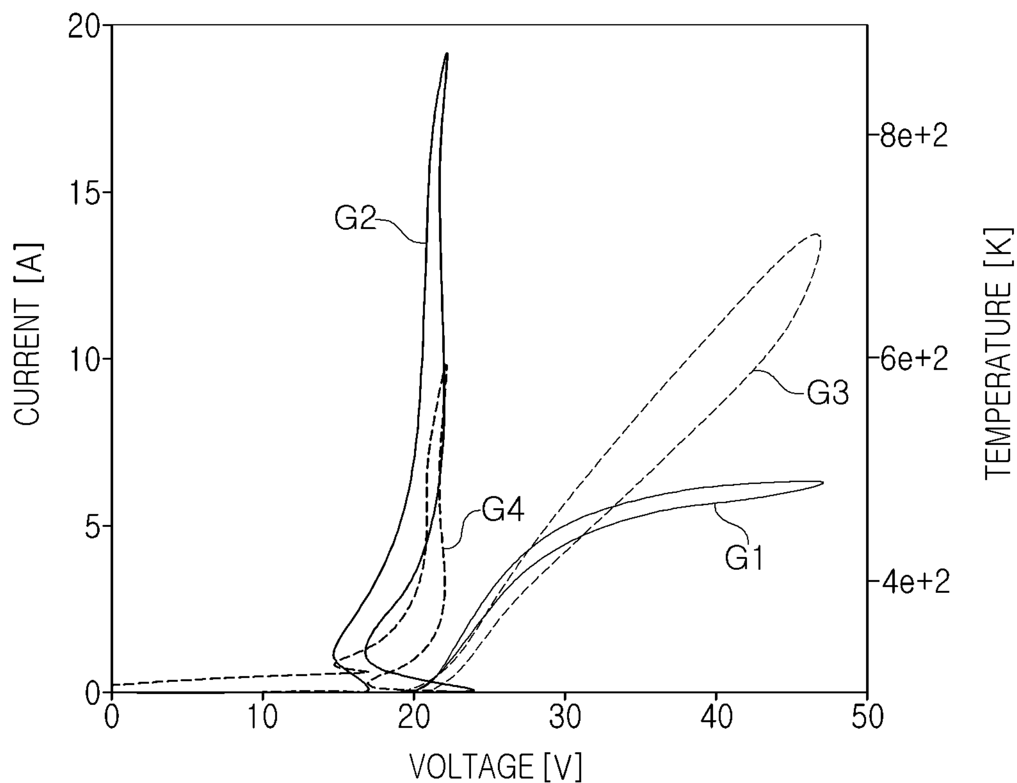
FIGS. 8 and 9 are views illustrating an effect of a semiconductor protection device according to an example embodiment.
Figure 9:
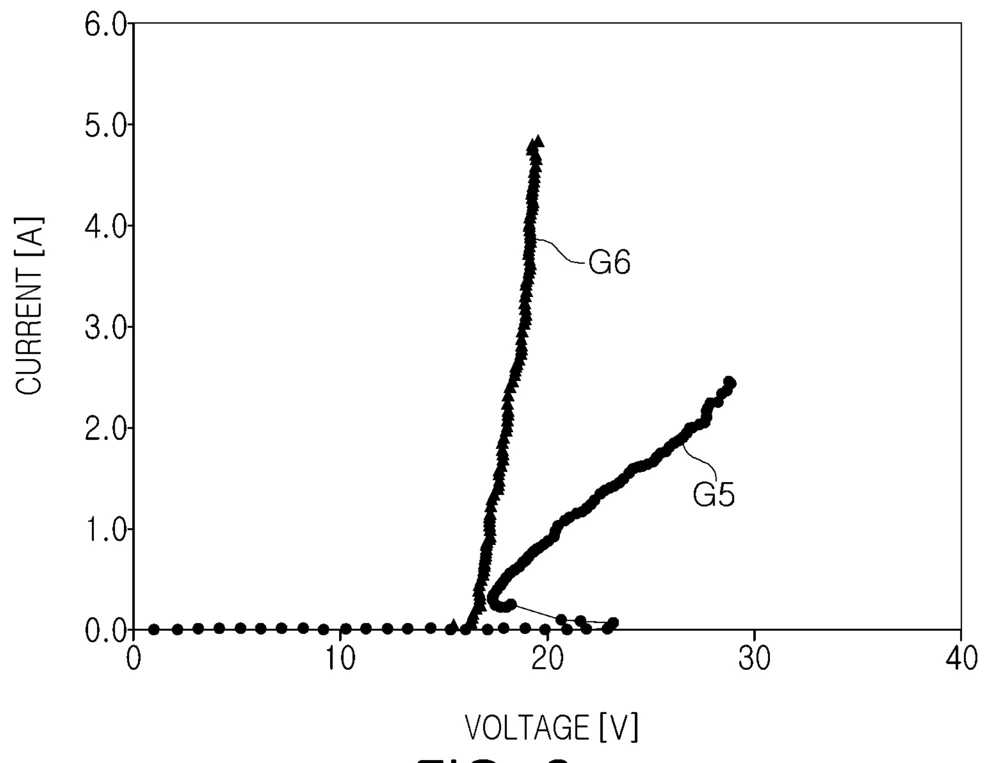

In addition, the semiconductor protection device according to an example embodiment may have an effect of reducing ON-resistance $R_{ON}$ based on the same area. This will be described with reference to FIGS. 8 and 9. FIGS. 8 and 9 illustrate characteristic curves of a semiconductor protection device of an example embodiment and a semiconductor protection device according to a comparative example. FIG. 8 illustrates a simulation result, and FIG. 9 illustrates an actually measured data result. G1 is a voltage-current curve of the comparative example, and G2 is a voltage-current curve of the example embodiment. G3 is a voltage-temperature curve of the comparative example, and G4 is a voltage-temperature curve of the example embodiment. G5 is a voltage-current curve of the comparative example, and G6 is a voltage-current curve of the example embodiment.

In the comparative example, it can be seen that maximum current in the voltage-current curve is 6.5 A, and a lattice temperature in the voltage-temperature curve is 700K or more. On the other hand, in the example embodiment, it can be seen that maximum current is 19 A in the voltage-current curve, and a lattice temperature is 600K or less in the voltage-temperature curve. That is, it can be seen that ON-resistance $R_{ON}$ in the example embodiment is lower than ON-resistance in the comparative example. In addition, it can be seen that in the example embodiment, the maximum current is increased and the temperature is decreased, as compared with the comparative example.

Figure 5:
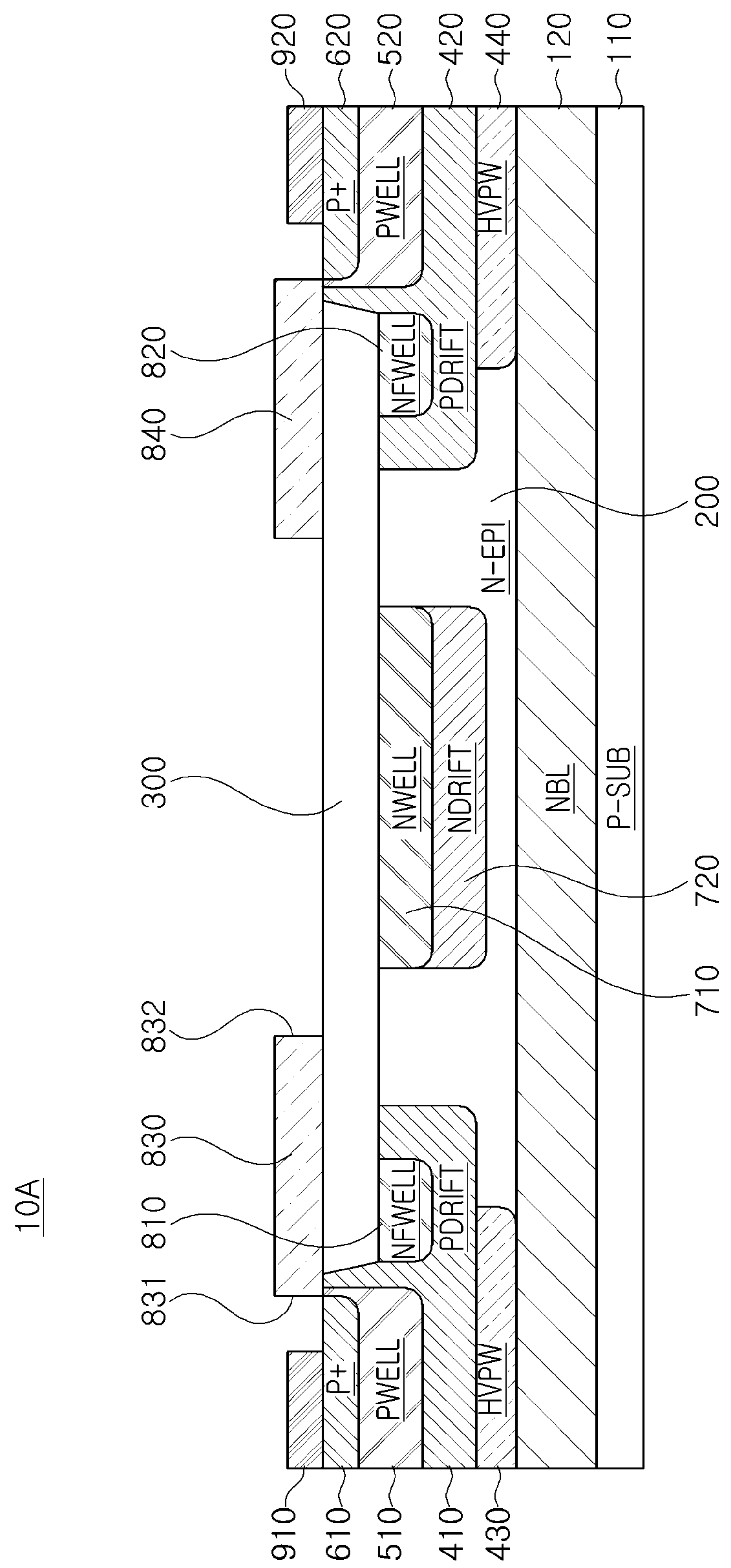
FIGS. 5 to 7 are cross-sectional views of semiconductor protection devices according to example embodiments, respectively.
Figure 6:
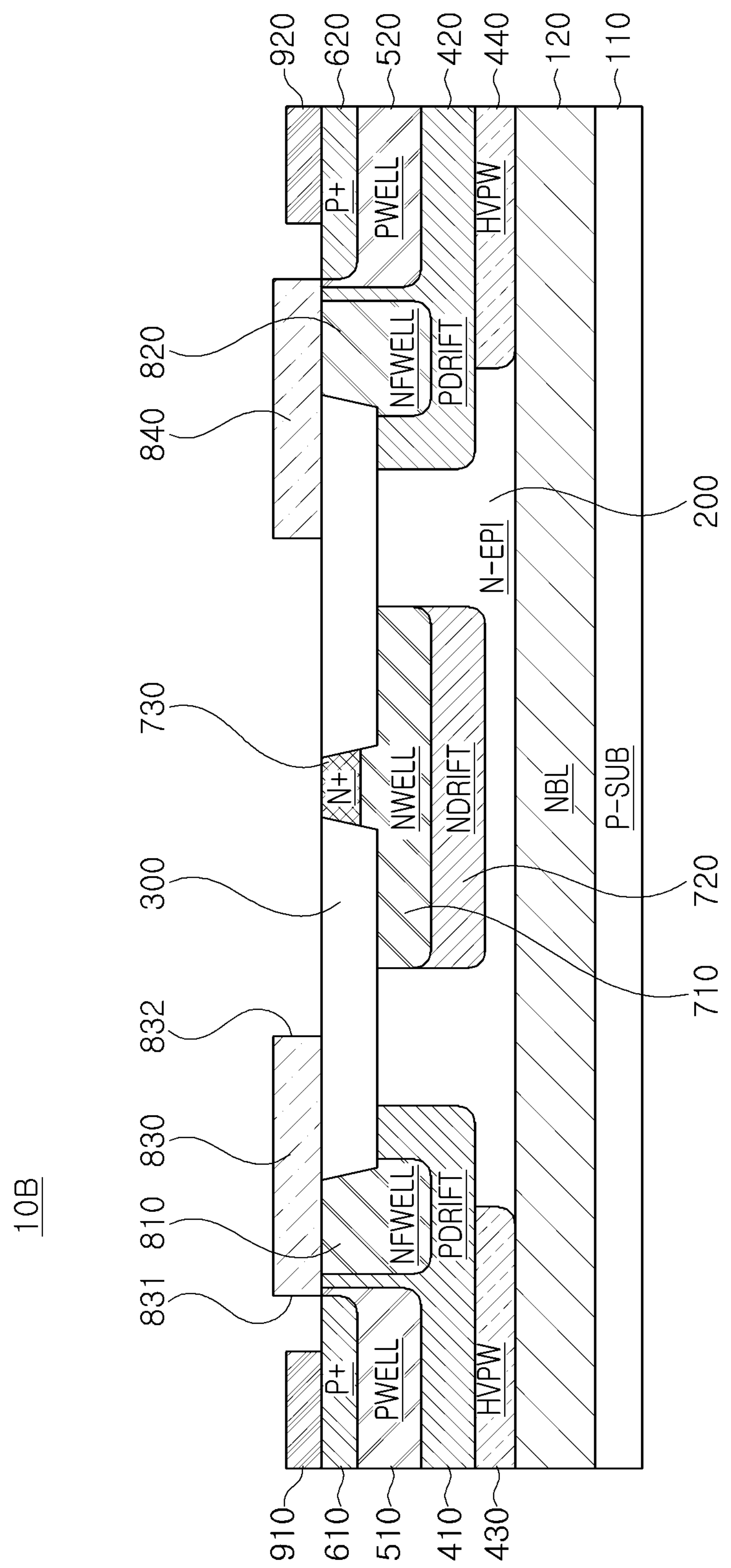
Figure 7:
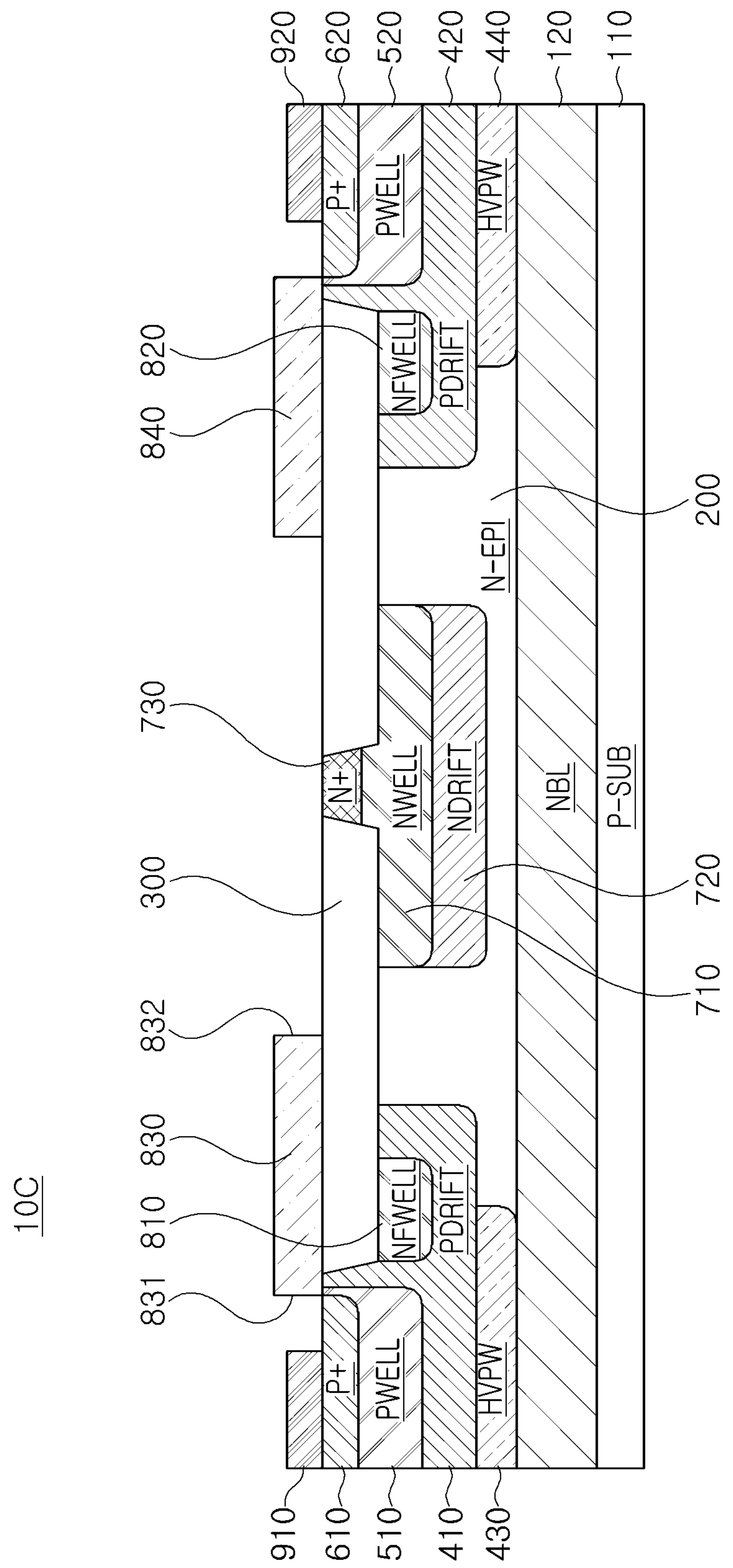

A semiconductor protection device according to an example embodiment will be described with reference to FIGS. 5 to 7. FIGS. 5 to 7 are cross-sectional views of semiconductor protection devices according to example embodiments, respectively. Since the same reference numerals as in the above-described embodiment refer to the same elements, repeated description of the same elements as that described above will be omitted, and the differences will be mainly described.

Referring to FIG. 5, in a semiconductor protection device 10A according to an exemplary embodiment, first and second N-type floating wells 810 and 820 may be formed below a device isolation layer 300, as compared with the above-described exemplary embodiment. When the first and second N-type floating wells 810 and 820 are formed below the device isolation layer 300, the device isolation layer 300 may serve as a type of buffer to prevent impurities, implanted during an impurity doping process of forming the first and second N-type floating wells 810 and 820, from being excessively deeply doped. Accordingly, the first and second N-type floating wells 810 and 820 may be prevented from being formed through first and second P-type drift regions 410 and 420. In addition, since there is a large difference in implantation energy between the first and second N-type floating wells 810 and 820 and the first and second P-type drift regions 410 and 420, the first and second N-type floating wells 810 and 820 may be easily formed.

Referring to FIG. 6, in a semiconductor protection device 10B according to an example embodiment, an N-type doped region 730 may be further formed in a center of a device isolation layer 300, as compared with the above-described example embodiment. The N-type doped region 730 may be formed in a bar shape in the center of the isolation layer 300. A thickness of the N-type doped region 730 may be lower than a thickness of the device isolation layer 300. The N-type doped region 730 may increase a concentration of impurities in the semiconductor protection device 10 to improve a flow of current.

Referring to FIG. 7, in a semiconductor protection device 10C according to an example embodiment, first and second N-type floating wells 810 and 820 may be formed below a device isolation layer 300 and an N-type doped region 730 may be formed in a center of the device isolation layer 300, as compared with the above-described embodiment. The semiconductor protection device 10C according to an example embodiment may have all of the effects described above with respect to the semiconductor protection device 10A of FIG. 5 and the semiconductor protection device 10B of FIG. 6.

Hereinafter, a process of fabricating a semiconductor protection device according to an example embodiment will be described with reference to FIGS. 10 to 17. FIGS. 10 to 17 are cross-sectional views illustrating a process of fabricating the semiconductor protection device of FIG. 1.

Figure 10:
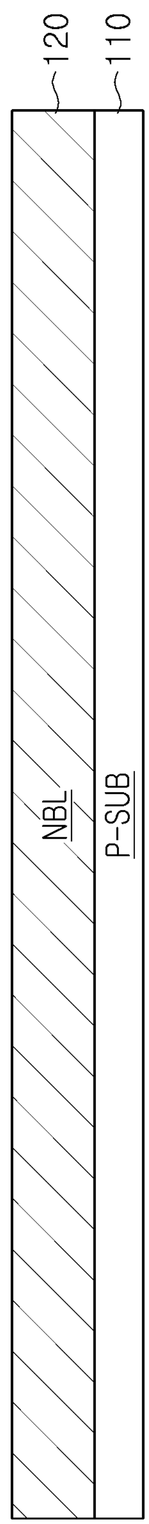
FIGS. 10 to 16 are cross-sectional views illustrating a process of fabricating the semiconductor protection device of FIG. 1.

Referring to FIG. 10, an N-type buried layer 120 may be formed on a substrate 110. The substrate 110 may be, for example, a silicon substrate, a gallium arsenide substrate, a silicon-germanium substrate, a ceramic substrate, a quartz substrate, a glass substrate for a display device, or a semiconductor on insulator (SOI) substrate. The N-type buried layer 120 may be formed by performing an ion implantation process, using N-type impurities, on the substrate 110.

Figure 11:
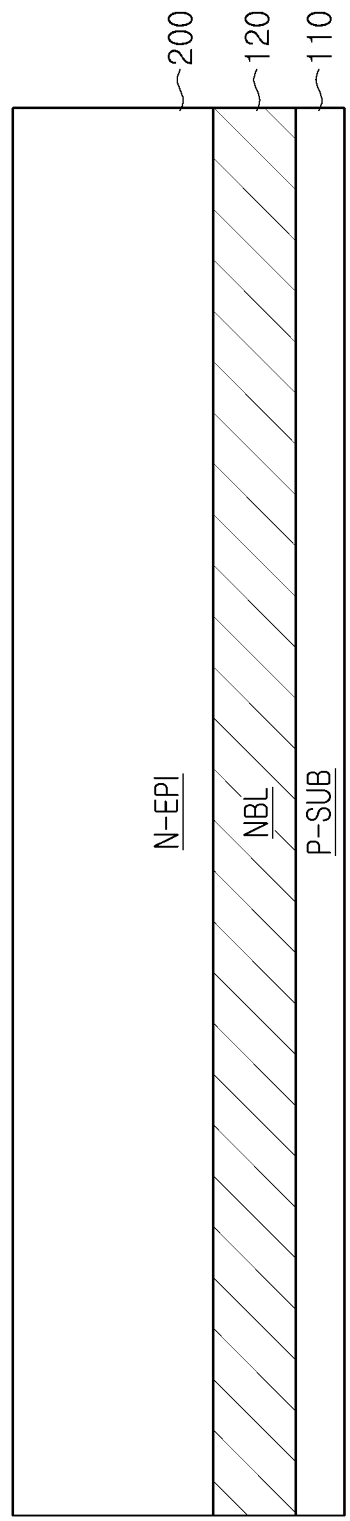

Referring to FIG. 11, an N-type epitaxial layer 200 may be formed on the N-type buried layer 120. For example, the N-type epitaxial layer 200 may be formed using a selective epitaxial growth (SEG) method, a solid phase epitaxial growth (SPE) method, or the like.

Figure 12:
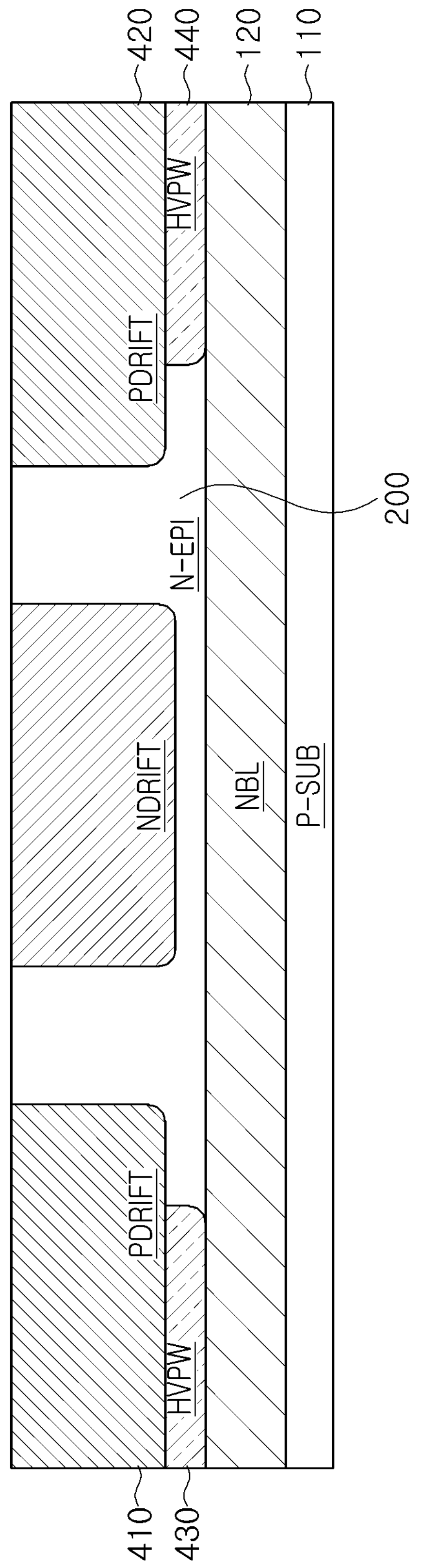

Referring to FIG. 12, first and second P-type drift regions 410 and 420, first and second high voltage P-type wells 430 and 440, and an N-type drift region 720 may be formed in the N-type epitaxial layer 200.

Figure 13:
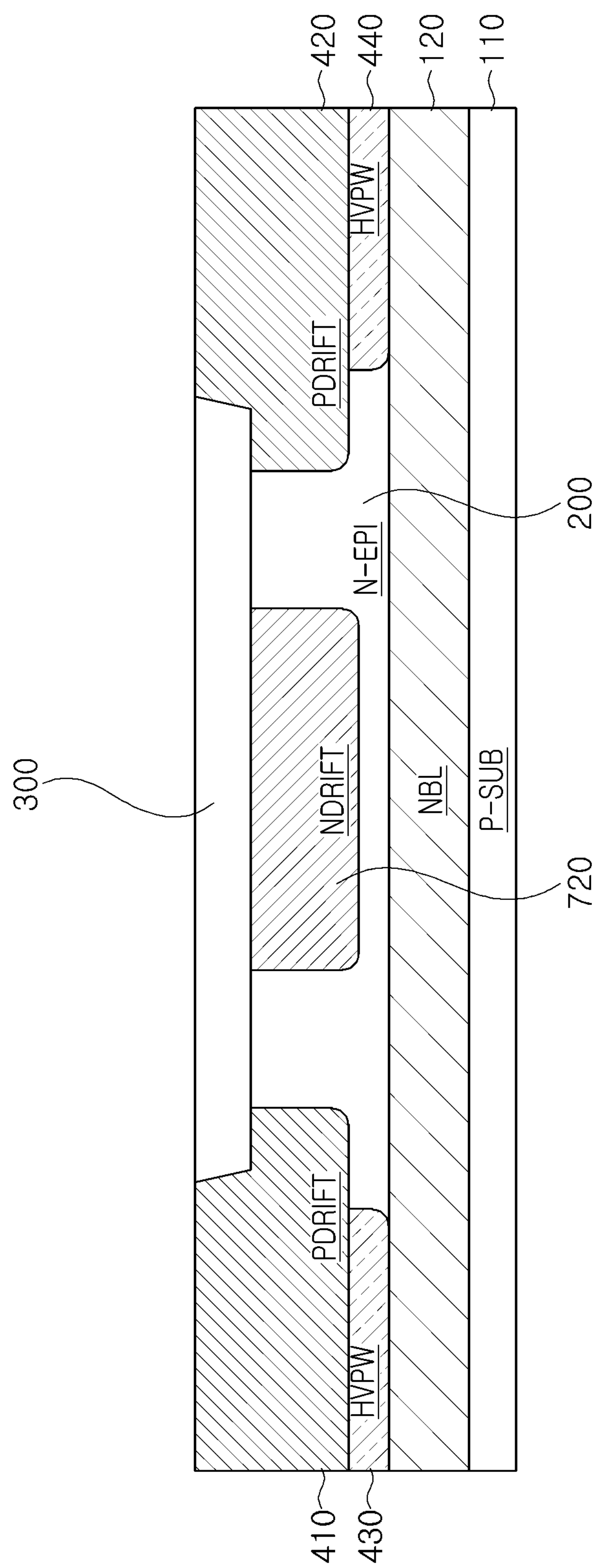

Referring to FIG. 13, a device isolation layer 300 may be formed on an upper surface of the N-type epitaxial layer 200. The device isolation layer 300 may be formed to be in contact with the first and second P-type drift regions 410 and 420, and may be formed to cover an entire upper surface of the N-type epitaxial layer 200 except for the first and second P-type drift regions 410 and 420. The device isolation layer 300 may be formed by a shallow trench isolation (STI) process, or the like. The device isolation layer 300 may be formed by depositing an oxide such as $SiO_2$.

Figure 14:
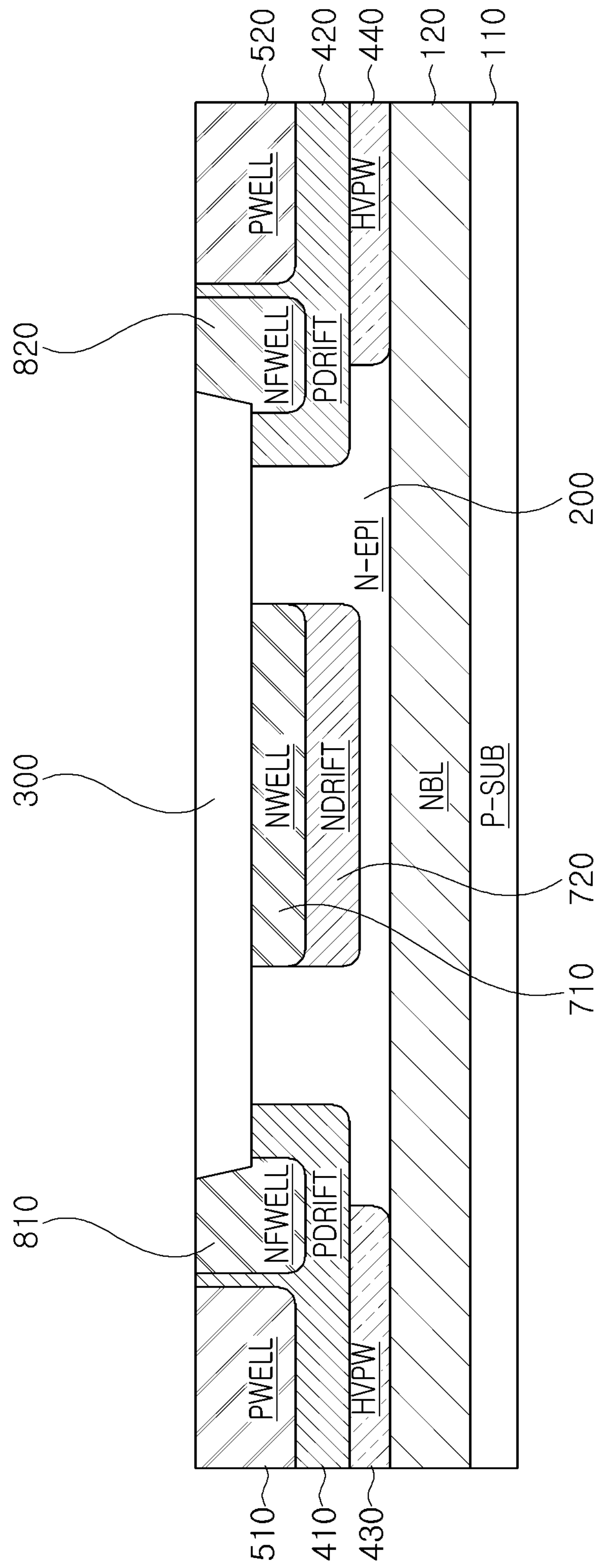

Referring to FIG. 14, first and second P-type wells 510 and 520 and first and second N-type floating wells 810 and 820 may be formed in the first and second P-type drift regions 410 and 420, respectively, and an N-type well 710 may be formed below the device isolation layer 300. The first and second N-type floating wells 810 and 820 may be simultaneously doped with the same N-type impurities as the N-type well 710. Accordingly, an impurity concentration of the first and second N-type floating wells 810 and 820 may be substantially the same as an impurity concentration of the N-type well 710. In addition, the first and second N-type floating wells 810 and 820 may be formed to have substantially the same depth as the N-type well 710.

Figure 15:
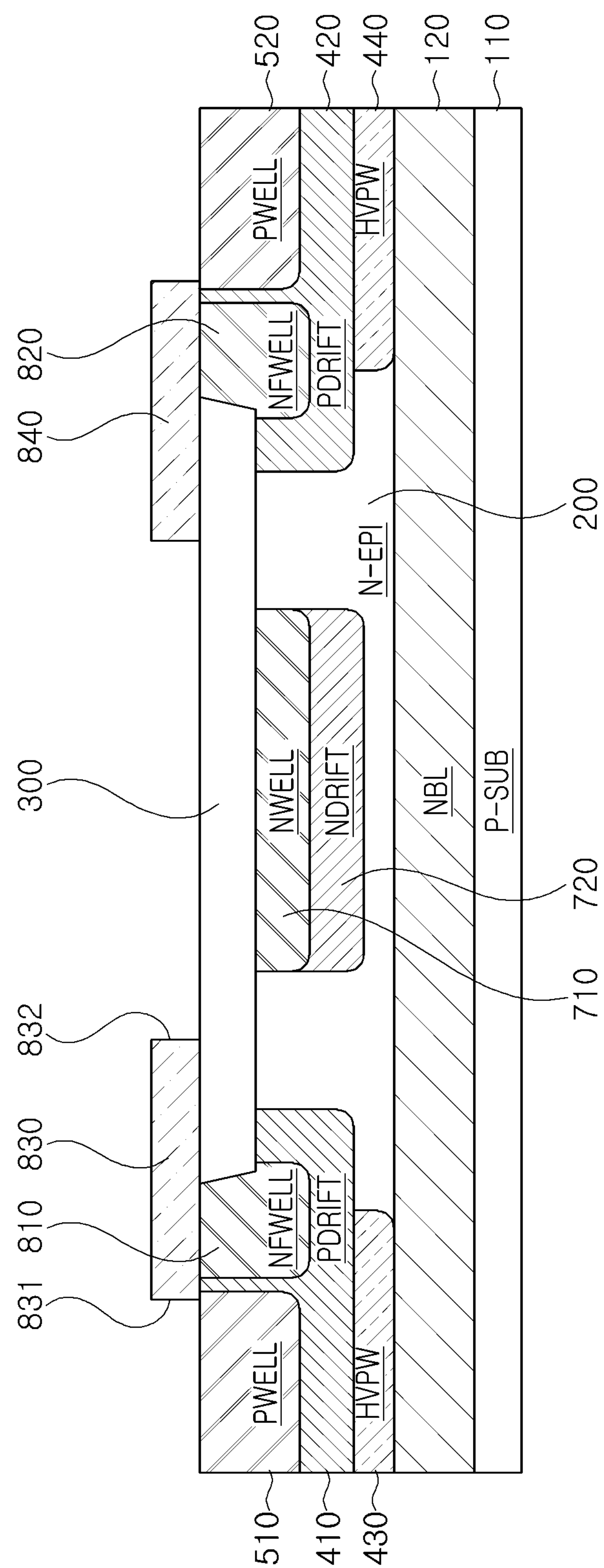

Referring to FIG. 15, first and second contact layers 830 and 840 may be formed on the N-type epitaxial layer 200. The first and second contact layers 830 and 840 may be formed to be in contact with the first and second N-type floating wells 810 and 820, the first and second P-type drift regions 410 and 420, and the device isolation layer 300. In an example embodiment, the first and second contact layers 830 and 840 may be formed by forming an oxide layer on upper surfaces of the first and second P-type drift regions 410 and 420 and the first and second N-type floating wells 810 and 820, depositing a polysilicon layer on the oxide layer, and patterning the resultant structure.

Figure 16:
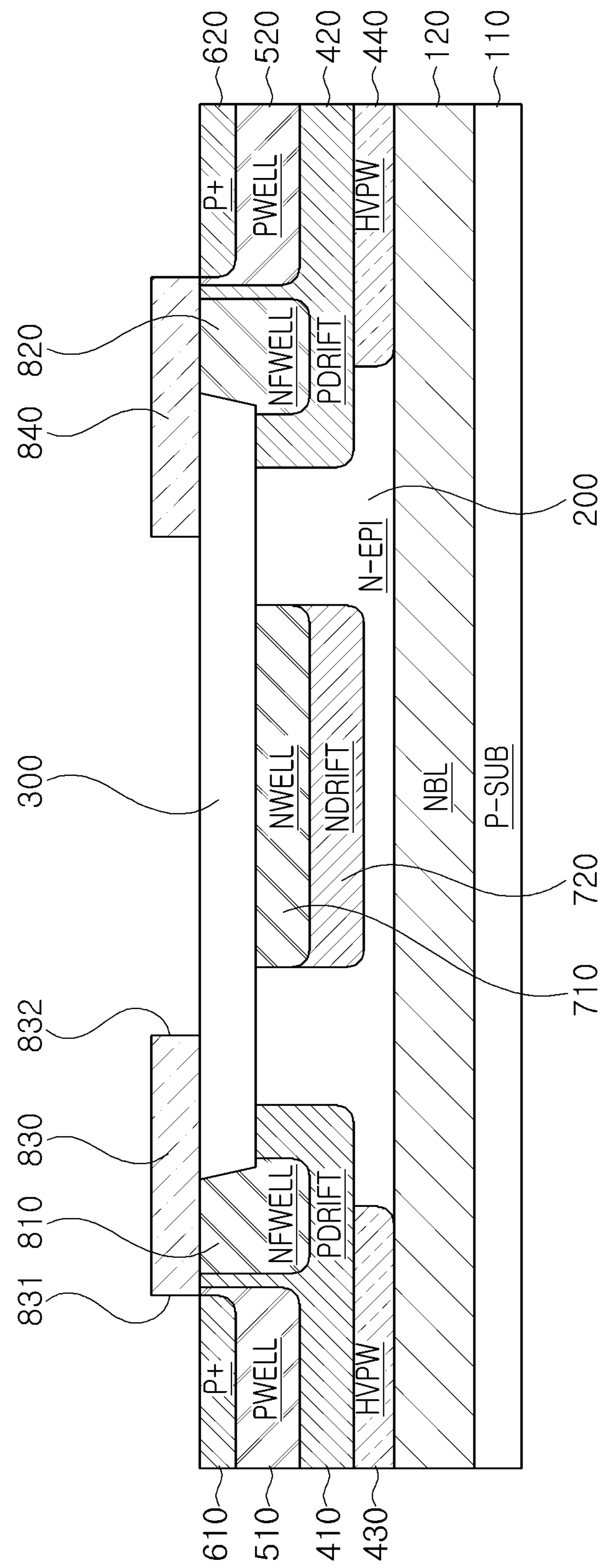

Referring to FIG. 16, first and second P-type doped regions 610 and 620 may be formed in the first and second P-type wells 510 and 520, respectively. The first and second P-type doped regions 610 and 620 may be formed in the first and second P-type wells 510 and 520, respectively. The first and second P-type doped regions 610 and 620 may be self-aligned in the first and second P-type wells 510 and 520 using the first and second contact layers 830 and 840 as masks, respectively. In an example embodiment, an impurity concentration of the first and second P-type doped regions 610 and 620 may be higher than an impurity concentration of the first and second P-type wells 510 and 520.

Next, when the first and second electrodes 910 and 920 are respectively formed in the first and second P-type doped regions 610 and 620, the semiconductor protection device 10 of FIG. 1 may be fabricated. Then, a backend process of a BCD process may be performed.

As described herein, a semiconductor device having improved breakdown voltage characteristics and reduced ON-resistance $R_{ON}$ may be provided.

While example embodiments have been shown and described above, it will be apparent to those skilled in the art that modifications and variations could be made without departing from the scope of the present inventive concept as defined by the appended claims.

What is claimed is:

1. A semiconductor protection device comprising:

an N-type buried layer on a P-type substrate;

an N-type epitaxial layer on the N-type buried layer;

a device isolation layer on an upper surface of the N-type epitaxial layer;

an N-type drift region below the device isolation layer;

an N-type well in the N-type drift region;

first and second P-type drift regions, each of the first and second P-type drift regions in contact with a respective opposite end of the device isolation layer and spaced apart from the N-type drift region;

first and second high voltage P-type wells below the first and second P-type drift regions and in contact with the N-type buried layer;

first and second P-type wells, each of the first and second P-type wells in a respective one of the first and second P-type drift regions;

first and second N-type floating wells, each of the first and second N-type floating wells in the respective one of the first and second P-type drift regions and spaced apart from a respective one of the first and second P-type wells, and wherein each of the first and second N-type floating wells is in contact with the respective one of the opposite ends of the device isolation layer;

first and second P-type doped regions, each of the first and second P-type doped regions in the respective one of the first and second P-type wells;

a first contact layer on the N-type epitaxial layer and in contact with the first N-type floating well and the device isolation layer;

a second contact layer on the N-type epitaxial layer and in contact with the second N-type floating well and the device isolation layer;

a cathode electrode on the first P-type doped region and spaced apart from the first contact layer; and an anode electrode on the second P-type doped region and spaced apart from the second contact layer.

2. The semiconductor protection device of claim 1, wherein each of the first and second N-type floating wells is below the device isolation layer.

3. The semiconductor protection device of claim 1, wherein a lower surface of the N-type well and lower surfaces of the first and second N-type floating wells have a same width.

4. The semiconductor protection device of claim 1, wherein the N-type well and the first and second N-type floating wells are doped with the same N-type impurities.

5. The semiconductor protection device of claim 1, wherein the first and second N-type floating wells are doped at the same impurity concentration.

6. The semiconductor protection device of claim 1, further comprising:

an N-type doped region in the device isolation layer, wherein the N-type doped region is in contact with an upper surface of the N-type epitaxial layer and the N-type well, and wherein a thickness of the N-type doped region is less than a thickness of the device isolation layer.

7. The semiconductor protection device of claim 1, wherein the first and second contact layers comprise a material including at least one of polysilicon, tungsten, and aluminum.

8. The semiconductor protection device of claim 1, wherein the first and second P-type doped regions do not overlap the first and second contact layers.

9. A semiconductor protection device comprising:

an N-type epitaxial layer;

a device isolation layer on an upper surface of the N-type epitaxial layer;

an N-type drift region below the device isolation layer;

an N-type well in the N-type drift region;

first and second P-type drift regions, each of the first and second P-type drift regions in contact with a respective opposite end of the device isolation layer, and spaced apart from the N-type drift region;

first and second P-type doped regions, each of the first and second P-type doped regions in a respective one of the first and second P-type drift regions;

first and second N-type floating wells, each of the first and second N-type floating wells in the respective one of the first and second P-type drift regions and spaced apart from a respective one of the first and second P-type doped regions, and wherein each of the first and second N-type floating wells is in contact with the respective one of the opposite ends of the device isolation layer;

a first contact layer on the N-type epitaxial layer and in contact with the first N-type floating well and the device isolation layer; and a second contact layer on the N-type epitaxial layer and in contact with the second N-type floating well and the device isolation layer.

10. The semiconductor protection device of claim 9, further comprising:

first and second P-type wells, each of the first and second P-type wells in the respective one of the first and second P-type drift regions, and wherein the first and second P-type wells each overlap the respective one of the first and second P-type doped regions.

11. The semiconductor protection device of claim 10, wherein the first P-type doped region is in the first P-type well, and wherein the second P-type doped region is in the second P-type well.

12. The semiconductor protection device of claim 9, wherein the first and second N-type floating wells are mirror-symmetrical with respect to the N-type well.

13. The semiconductor protection device of claim 9, wherein the first and second N-type floating wells are in contact with the device isolation layer.

14. The semiconductor protection device of claim 9, wherein the first and second N-type floating wells are doped at a similar impurity concentration as the N-type well.

15. A semiconductor protection device comprising:

a first conductivity-type epitaxial layer comprising first and second regions, wherein the first region comprises:

a device isolation layer on an upper surface of the first conductivity-type epitaxial layer, wherein the device isolation layer overlaps a central axis of the semiconductor protection device;

a first conductivity-type drift region below the device isolation layer;

a first conductivity-type well in the first conductivity-type drift region;

a second conductivity-type drift region in contact with the device isolation layer and spaced apart from the first conductivity-type drift region;

a high voltage second conductivity-type well below the second conductivity-type drift region;

a second conductivity-type doped region in the second conductivity-type drift region;

a first conductivity-type floating well spaced apart from the second conductivity-type doped region in the second conductivity-type drift region;

a contact layer on the first conductivity-type epitaxial layer, wherein the contact layer overlaps the first conductivity-type floating well and is in contact with the device isolation layer; and an electrode on the second conductivity-type doped region and spaced apart from the contact layer, and wherein the second region and the first region are mirror-symmetrical.

16. The semiconductor protection device of claim 15, further comprising:

a first conductivity-type doped region in contact with the first conductivity-type well at the central axis.

17. The semiconductor protection device of claim 15, wherein the first conductivity-type floating well is spaced apart from the device isolation layer.

18. The semiconductor protection device of claim 15, wherein the first conductivity-type floating well is in contact with the device isolation layer.

19. The semiconductor protection device of claim 15, wherein the first conductivity-type floating well does not overlap the contact layer.

20. The semiconductor protection device of claim 15, wherein the first conductivity-type floating well is below the device isolation layer.

* * * * *